United States Patent
Li et al.

(10) Patent No.: US 7,868,615 B2
(45) Date of Patent: Jan. 11, 2011

(54) METHOD AND DEVICE FOR SUPPRESSING MOTION ARTIFACTS IN MAGNETIC RESONANCE IMAGING

(75) Inventors: Guo Bin Li, Shenzhen (CN); Wei Jun Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 207 days.

(21) Appl. No.: 12/344,958

(22) Filed: Dec. 29, 2008

(65) Prior Publication Data

US 2010/0164493 A1    Jul. 1, 2010

(30) Foreign Application Priority Data

Dec. 29, 2007    (CN) .................. 2007 1 0301665

(51) Int. Cl.
*G01V 3/00* (2006.01)

(52) U.S. Cl. ...................................... 324/309; 324/307

(58) Field of Classification Search ......... 324/300–322; 600/407–445
See application file for complete search history.

(56) References Cited

U.S. PATENT DOCUMENTS

| | | | |
|---|---|---|---|
| 6,118,273 A * | 9/2000 | Takizawa et al. | 324/309 |
| 6,614,225 B1 * | 9/2003 | Feinberg | 324/307 |
| 6,630,828 B1 * | 10/2003 | Mistretta et al. | 324/309 |
| 6,894,494 B2 * | 5/2005 | Stergiopoulos et al. | 324/309 |
| 7,436,178 B2 * | 10/2008 | Keupp et al. | 324/318 |
| 7,622,926 B2 * | 11/2009 | Taniguchi et al. | 324/318 |
| 2007/0167717 A1 * | 7/2007 | James et al. | 600/407 |
| 2008/0068014 A1 * | 3/2008 | Dannels | 324/312 |

* cited by examiner

*Primary Examiner*—Brij B Shrivastav
(74) *Attorney, Agent, or Firm*—Schiff Hardin LLP

(57) ABSTRACT

In a method and device for suppressing residual motion artifacts, k-space is divided into a snapshot segment, an alternate sampling segment and a high frequency segment in a phase encoding direction; then phase encoding lines are respectively sampled within each of the segments; and a magnetic resonance image is reconstructed according to the phase encoding lines within k-space.

18 Claims, 2 Drawing Sheets

US 7,868,615 B2

METHOD AND DEVICE FOR SUPPRESSING MOTION ARTIFACTS IN MAGNETIC RESONANCE IMAGING

BACKGROUND OF THE INVENTION

1. Field of the Invention

The present invention relates to magnetic resonance image (MRI) technology, and particularly to a method for suppressing residual motion artifacts and a device for suppressing residual motion artifacts.

2. Description of the Prior Art

K-space is an important concept in MRI technology. K-space is an abstract space, and is also called Fourier Space. Magnetic resonance (MR) imaging data are arranged at specific positions in k-space according to different space frequencies, which are used to describe certain energy propagating in the form of waves in space, therefore, k-space can also be understood as a space filled with the original data of MR signals having space location encoding information. Each MR image has its corresponding K-space data, and by Fourier transform performed on the k-space data, the MR images can be reconstructed.

K-space can be two-dimensional, and it can also be three-dimensional. The abscissa Kx and the ordinate Ky in two-dimensional k-space are perpendicular to each other, and if Kx represents the phase encoding direction of the MR signals, then Ky represents the frequency encoding direction (also called readout direction) of the MR signals, as shown in FIG. 1. The Kx axis, Ky axis, Kz axis in a three-dimensional K-space are perpendicular to one another, and if Kx represents the phase encoding direction of the MR signals, Ky represents the frequency encoding direction, then Kz represents the level selection direction of the MR signals.

Referring to the two-dimensional k-space shown in FIG. 1, the sampling process for the MR signals is as follows: the direction and the field strength of the phase encoding gradient field of the MR signals are changed according to a preset step, the MR signals are sampled once for each time this change is made, and the sampled MR signals are filled into a corresponding line in K-space, the line is parallel to the readout direction and it is called a phase encoding line. In the figure, a0, a1 . . . an are shown in a phase encoding lines. As to a three-dimensional k-space, there is also a process similar to the above sampling process.

As mentioned above, the MR imaging data are actually arranged at specific positions in k-space according to different energy levels, and the energy in k-space follows an exponential decline from the middle to two sides, therefore, the energy in k-space is mainly distributed in a concentrated way in the middle of k-space and the two sides adjacent to the middle.

When an object being sampled is in a state of motion, what is sampled each time will not be a static object, but rather a number of objects on the trajectory of the object, that is to say, certain energy will always be sampled along the trajectory of this object, and such energy will leave some shadows on the MR images along the phase encoding direction. These shadows are called motion artifacts. It has been found in the clinical application of MRI technology that a human body's physiological movements, the movements of blood flow and so on will all lead to the production of motion artifacts during a imaging process, and which in turn cause the deterioration of the diagnostic quality by the magnetic resonance. There are various technical solutions for suppressing such movement in prior art, and two typical ones are introduced herein below.

The first technical solution: The physiological movements, such as by a heart, breath and so on, are synchronized by using various gate-control technologies so as to achieve the goal of filtering out the motion artifacts from the magnetic resonance images.

The second technical solution: The signals originated from the motion tissues are suppressed by using a space pre-saturating technology, so as suppress the signals, such as those from blood flow, brain liquid, etc.

Both of the above technical solutions assume that the physiological movements in a human body, the motion of blood flow, etc. are in accordance with some certain fixed rules, but in fact, the above assumption is not valid, because physiological movements in human bodies, motion of the blood flow, etc. usually are not completely regular. This leads to the case that there are always a small amount of residual motion artifacts left in the magnetic resonance images when using the above technical solutions.

As is apparent from the above discussion, after the motion artifacts are suppressed by using the prior art solutions, some residual motion artifacts will be left on the magnetic resonance image, therefore, using the prior art cannot suppress the motion artifacts very well.

SUMMARY OF THE INVENTION

An object of the present invention is to provide a method for suppressing residual motion artifacts, so as to suppress motion artifacts left in the magnetic resonance image.

An object of the present invention also is to provide a device for suppressing residual motion artifacts, so as to suppress motion artifacts left in the magnetic resonance image.

The above object is achieved by a method for suppressing residual motion artifacts including the steps of dividing an alternate sampling segment from k-space, the alternate sampling segment being perpendicular to a phase encoding direction; and, for this alternate sampling segment, exchanging the phase encoding direction and a readout encoding direction once for every N phase encoding lines being sampled, until all the phase encoding lines within the alternate sampling segment being sampled, wherein N is an integer greater than or equal to 1. A magnetic resonance image is reconstructed according to the phase encoding lines within k-space.

Dividing the alternate sampling segment from k-space can be accomplished by dividing k-space into five segments along the direction perpendicular to the phase encoding direction, and setting the width of each of the segments respectively, taking the segment located in the middle of k-space as a snapshot segment, taking the two segment adjacent to the two sides of the snapshot segment as the alternate sampling segments, and taking the segments adjacent to the outer sides of the alternate sampling segments as high frequency segments.

Setting the width of each of the segments can be accomplished by setting the width of the snapshot segment according to the number N of phase encoding lines that can be sampled during a cycle of a physiological activity, setting the width of the alternate sampling segments according to the width of the snapshot segment and the energy distribution within k-space, and setting the width of the high frequency segments at the number of the phase encoding lines except the width of the snapshot segment and the width of the alternate sampling segments.

Setting the width of the snapshot segment according to the number N of phase encoding lines that can be sampled during a cycle of a physiological activity can be accomplished by setting a threshold of the phase encoding lines, setting the width of the snapshot segment as N/3 if the number N of the phase encoding lines that can be sampled during the cycle of a physiological activity is greater than said threshold of the phase encoding lines, and otherwise setting the width of the snapshot segment as zero.

Setting the width of the alternate sampling segments according to the width of the snapshot segment and the energy distribution within k-space can be accomplished by setting an energy percentage; determining the width of k-space occupied by the energy which accounts for the energy percentage of the total energy in k-space according to the energy distribution within k-space; and setting said difference between the width of k-space and the width of the snapshot segment as the width of the alternate sampling segments.

Exchanging the phase encoding direction and the readout encoding direction once for every N phase encoding lines being sampled can be accomplished by sampling for N times the phase encoding lines according to a natural number sequence of the encoding steps, and exchanging the phase encoding direction and the readout encoding direction once.

Exchanging the phase encoding direction and the readout encoding direction once for every N phase encoding lines being sampled can be accomplished by randomizing the number in accordance with the natural number sequence of the encoding steps so as to obtain a randomized sampling sequence; sampling for N times the phase encoding lines according to the randomized sampling sequence, and exchanging the phase encoding direction and the readout encoding direction once.

Furthermore, after all the phase encoding lines within the alternate sampling segment have been sampled, the method can include the step of combining the phase encoding lines overlapping within the alternate sampling segment to obtain combination results, and filling the combination results back into corresponding positions within the alternate sampling segment.

Combining the phase encoding lines overlapping within the alternate sampling segment to obtain combination results can be accomplished by generating a weighted sum of the overlapped phase encoding lines according to preset weight values and using the results obtained by producing the weighted sum as the combination results.

A device for suppressing residual motion artifacts, includes a segmentation module that divides an alternate sampling segment from k-space, the alternate sampling segment being perpendicular to a phase encoding direction, a sampling module that samples phase encoding lines within the alternate sampling segment, that exchanges the phase encoding direction and a readout encoding direction once for every N phase encoding lines being sampled until all the phase encoding lines within the alternate sampling segment are sampled N being an integer greater than or equal to 1, and a reconstructing module that reconstructs the magnetic resonance image according to the phase encoding lines within k-space.

The segmentation module can also be configured to divide k-space into five segments along the direction perpendicular to the phase encoding direction, and to set the width of each of the segments respectively with the segment located in the middle of k-space being used as a snapshot segment, the segments adjacent to the two sides of the snapshot segment being used as the alternate sampling segments, and the segments adjacent to outer sides of the alternate sampling segments being used as high frequency segments.

The segmentation module can also be configured to set the width of said snapshot segment according to the number N of phase encoding lines that can be sampled during a cycle of a physiological activity, and to set the width of the alternate sampling segments according to the width of the snapshot segment and the energy distribution within k-space; and to set the width of the high frequency segments at the number of the phase encoding lines except the width of the snapshot segment and the width of the alternate sampling segments.

Furthermore, the device can include a first storage module for storing a set threshold of the phase encoding lines, and the segmentation module is also configured to determine whether the number N of the phase encoding lines that can be sampled during a cycle of a physiological activity is greater than the set threshold of the phase encoding lines, and when it is, the module is configured to set the width of the snapshot segment at N/3; otherwise it sets the width of snapshot segment at zero.

The device can include a second storage module for storing a set energy percentage, and the segmentation module is configured to determine the width of k-space occupied by the energy that accounts for the energy percentage of the total energy in k-space according to the energy distribution within k-space; and to set the difference between the width of k-space and the width of the snapshot segment as the width of the alternate sampling segment.

The sampling module can also be configured to sample for N times the phase encoding lines according to a natural number sequence of the encoding steps, and to exchange the phase encoding direction and the readout encoding direction once.

The sampling module can also be configured to configured to randomize the number in accordance with the natural number sequence of the encoding steps so as to obtain a randomized sampling sequence, to sample for N times the phase encoding lines according to the randomized sampling sequence, and to exchange the phase encoding direction and the readout encoding direction once.

The device can additionally include a post-processing module that combines the phase encoding lines overlapping within the alternate sampling segment to obtain combination results, and that fills the combination results back into corresponding positions within the alternate sampling segment.

The post-processing module can also be configured to produce a weighted sum of the overlapped phase encoding lines according to preset weight values and to use the results obtained by producing the weighted sum as the combination results.

In the method and the device for suppressing residual motion artifacts described above by dividing out from k-space an alternate sampling segment perpendicular to the phase encoding direction, and when the phase encoding lines within the alternate sampling segment are sampled, and exchanging the phase encoding direction and the readout encoding direction when the phase encoding lines are sampled N times, the residual motion artifacts originally distributed simply along the phase encoding direction are caused to be dispersed along the phase encoding direction and the readout direction. Since the energy of the residual motion artifacts is fixed, by dispersing this fixed energy to many different locations, the present invention can make the energy at various positions relatively small, so as to achieve the object of suppressing the residual motion artifacts effectively by means of dispersing the energy of the motion artifacts.

DESCRIPTION OF THE PREFERRED EMBODIMENTS

In order to make the object, technical solution, and advantages of the present invention more apparent, the present invention will be further described in detail below by reference to the drawings and embodiments.

The basis of the present invention is dividing from k-space an alternate sampling segment perpendicular to the phase encoding direction, and implementing sampling by an alternate sampling manner when the phase encoding lines within the alternate sampling segment are sampled, i.e. exchanging the phase encoding direction and the readout encoding direction once for every N phase encoding lines being sampled, so that the residual motion artifacts originally distributed simply along the phase encoding direction are dispersed along the phase encoding direction and the readout direction, so as to achieve the object of suppressing the residual motion artifacts effectively by dispersing the energy of the motion artifacts.

Figure 1:
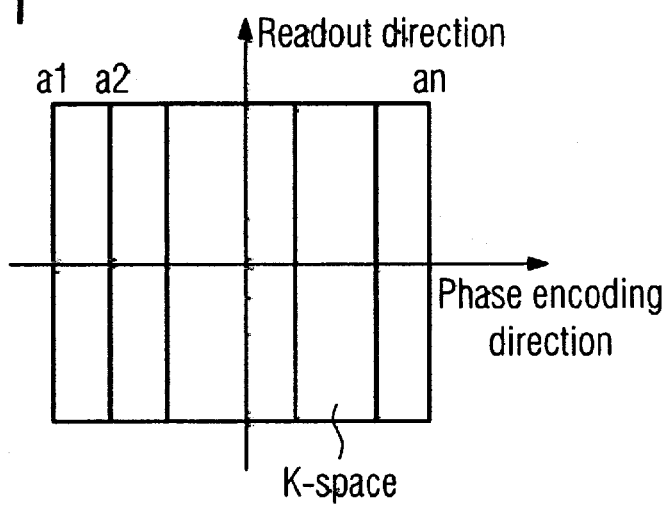
FIG. 1 is a schematic illustrate of a current two-dimensional k-space.
Figure 2:
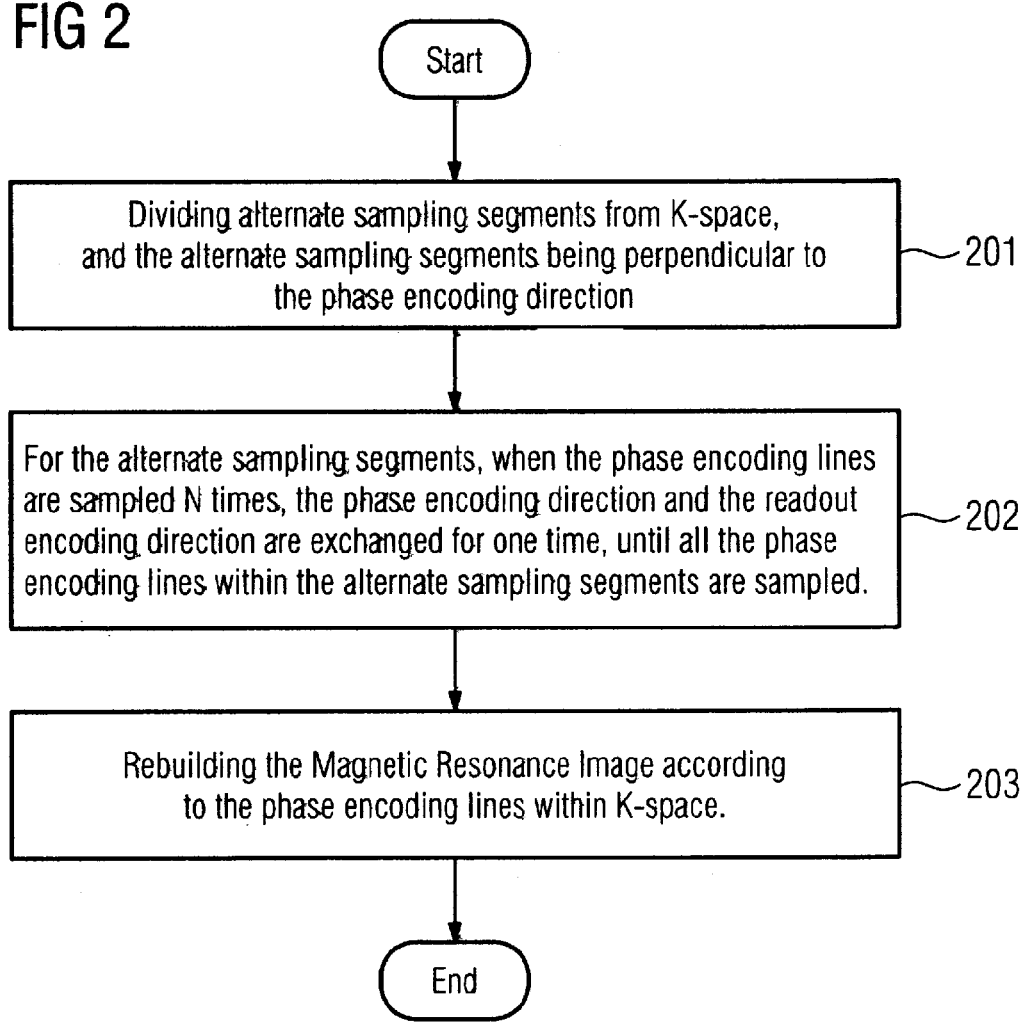
FIG. 2 is a flowchart of a method for suppressing residual motion artifacts of the present invention.

FIG. 2 is a flowchart of a method for suppressing residual motion artifacts according to the present invention. Referring to FIG. 2, this method includes:

Step 201: dividing from k-space an alternate sampling segment, the alternate sampling segment being perpendicular to a phase encoding direction.

Figure 3:
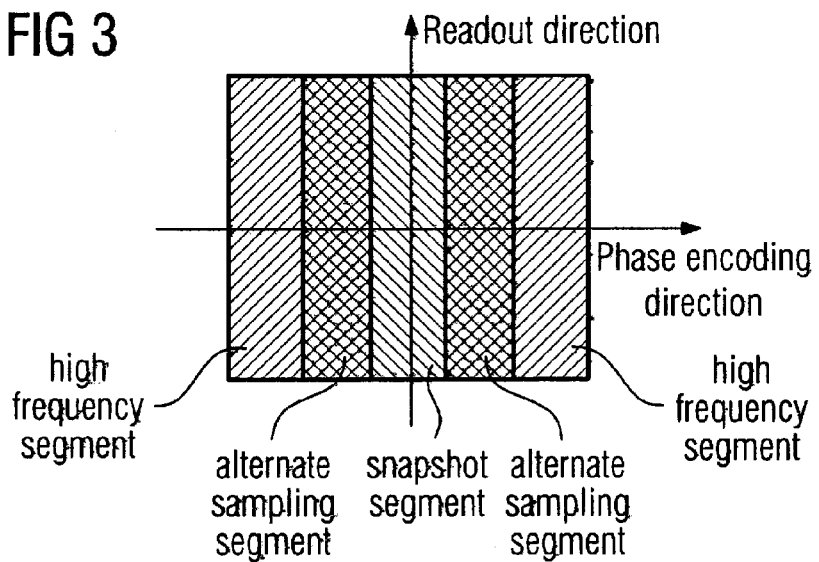
FIG. 3 is a schematic illustration of k-space division in accordance with the present invention.

In this step, k-space can be divided into five segments along the direction perpendicular to the phase encoding direction, and the width for each segment is set respectively; and then the segment located in the middle of k-space is used as a snapshot segment, and the segments adjacent to the two sides of the snapshot segment are used as the alternate segments, and the segments adjacent to the outer sides of the alternate segments are used as high frequency segments. After the above division, it produces a schematic view of k-space division as shown in FIG. 3. It should be noted that the object of this step is to divide out an alternate sampling segment of an appropriate width, so as to facilitate the sampling of the alternate sampling segment in an alternate sampling manner provided later in the present invention; as to the snapshot segment and the high frequency segments, they are both segments divided out to assist the explanation of the alternate sampling segment, and their way of sampling can be the same as in the prior art.

When setting the width for each of the segments, the width of the snapshot segment is first set according to the number N of phase encoding lines which can be sampled during a cycle of a physiological activity; then the width of the alternate sampling segments is set according to the width of the snapshot segment and the energy distribution within k-space; and finally the width of the high frequency segment being set at the number of the phase encoding lines is set, except the width of the snapshot segment and the width of the alternate sampling segment. More specifically:

1) when the speed of sampling is fast enough, the movement in the middle (central) part of k-space will be frozen, which will be represented in a magnetic resonance image as follows: when the speed of sampling is fast enough, there will be relatively few motion artifacts in the middle part of K-space, at this time, the middle part of K-space does not need to be sampled by the alternate sampling manner of the present invention (because when alternate sampling is carried out, it is necessary to change the phase encoding direction and the readout direction for every N phase encoding lines being sampled, so the sampling time in this manner is longer). Therefore, the width of the snapshot segment can be set, according to the number N of the phase encoding lines which can be sampled during a cycle of physiological activity. More particularly:

a threshold of the phase encoding line can be pre-set;

if N is greater than the threshold of the phase encoding line, such as N being greater than 30, thus N/3 phase encoding lines in the middle of k-space can be used as the phase encoding lines within the snapshot segment, so as to accomplish a snapshot of moving human tissues using less time;

if N is smaller, which indicates the sampling speed is relatively slow, but at this time, the movement of the middle of k-space cannot be frozen, therefore, the width of the snapshot segment can be set at zero.

2) As mentioned above, the alternate sampling segment can be sampled in the alternate sampling manner according to the present invention, so as to achieve the object for suppressing the residual motion artifacts. Its width can be set according to the width of the snapshot segment and the energy distribution within k-space. More particularly:

an energy percentage can be pre-set, for example, it can be set at 90%;

then, determining the width of k-space occupied by the energy of the energy percentage which is accounted for the total energy in k-space; i.e. the segment of space in k-space is determined that has distributed therein 90% of energy distributed in k-space, according to the energy distribution of k-space.

Finally, the difference between the width of k-space and the width of the snapshot segment is set as the width of the alternate sampling segment.

The width of the alternate sampling segment can be set freely, but almost all the energy in k-space except the energy within the snapshot segment should be included within the alternate sampling segment. In general, the wider the alternate sampling segment, the better the effects in suppressing residual motion artifacts, but correspondingly, the more time will be spent by sampling the alternate sampling segment.

3) The high frequency segment refers to the phase encoding lines in addition to the snapshot segment and the alternate sampling segment in k-space, the signal strength for these phase encoding lines are relatively low, which are mainly used to provide a higher image resolution.

In a practical application, the widths of the three segments can be optimized according to specific motion features, so as to obtain better results.

Step 202: for the alternate sampling segment, the phase encoding direction and a readout encoding direction are exchanged once for every N phase encoding lines being sampled until all the phase encoding lines within the alternate sampling segment have been sampled; and the N is an integer greater than or equal to 1.

Figure 4:
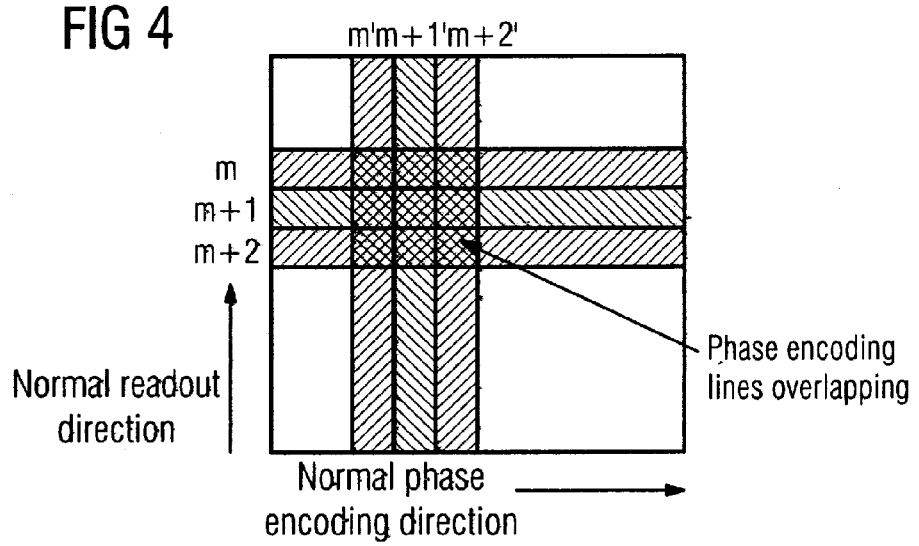
FIG. 4 schematically illustrates sampling the phase encoding line within alternate sampling segment by using an alternate sampling of the present invention.

In this step, "the phase encoding direction and a readout encoding direction are exchanged once for every N phase encoding lines being sampled" means that, after N phase encoding lines within the alternate sampling segment are sampled, the phase encoding direction and the readout encoding direction are exchanged, and N phase encoding lines are sampled in the direction of the new phase encoding lines of the same space positions in k-space, and then the phase encoding direction and the readout direction are exchanged, and next N phase encoding lines will be sampled until all the phase encoding lines within the alternate sampling segment are sampled. The schematic diagram of the phase encoding lines within an alternate sampling segment in a cross alternate sampling manner according to the present invention is shown in FIG. 4. With reference to FIG. 4, in this manner, the sampling order for the phase encoding lines within the alternate sampling segment is as follows:

{... m→m'→m+1→m+1'→m+2→m+2'... }

In the case of the cross alternate sampling manner, there can be overlapping between the phase encoding lines which are sampled, as shown in FIG. 4. At this time, after all the encoding lines within the alternate sampling segment are sampled, said phase encoding lines which are overlapped within alternate sampling segments are combined further so as to obtain the combination results, and the combination results are filled back to the corresponding positions of said alternate sampling segment. The overlapped phase encoding lines can be combined in various ways, preferably, a weighted sum of the overlapped phase encoding lines can be calculated according to the preset weight values, and the results obtained by weighted summation are used as the combination results.

In this step, when the phase encoding direction and a readout encoding direction are exchanged once for every N phase encoding lines being sampled, use can be made of the following two manners at the same time.

1. A sequential manner: that is, sampling for N times the phase encoding lines according to a natural number sequence of the encoding steps, and exchanging the phase encoding direction and the readout encoding direction once.

2. A random manner, first, randomizing the number in accordance with the natural number sequence of the encoding steps so as to obtain a randomized sampling sequence; sampling for N times the phase encoding lines according to the randomized sampling sequence, and exchanging the phase encoding direction and the readout encoding direction once. For example, assuming the serial numbers of the phase encoding lines within the alternate sampling segment are [1 2 3 4 13 14 15 16], these serial numbers are randomized and can become [4 13 2 1 16 14 15 3], at this time, the phase encoding lines within the high frequency segment will be sampled according to the new order. In this way, the residual motion artifacts will be dispersed further along the phase encoding direction and the readout direction, so as to further reduce the strength of the artifacts.

For the snapshot segment and the high frequency segment, the sampling can be carried out in the same manner as in the prior art, i.e. as described in the background art: the direction and the field strength of the phase encoding gradient field of the MR signals are changed according to preset steps, for each change, the MR signals are sampled once, and the sampled MR signals are filled into a corresponding phase encoding line within K-space.

Of course, for the snapshot segment and the high frequency segment, the sampling can also be done in the aforementioned sequential manner or the random manner.

Furthermore, each segment can be sampled according to any sequence. For example, it can be sampled according to the following order: sampling one side of the high frequency segment→sampling one side of the alternate sampling segment→sampling snapshot segment→sampling the other side of the alternate sampling segment→sampling the other side of the high frequency segment; of course the sampling can also be done according to other sequences, based on the requirements of a practical application, for example, first sampling the snapshot segment, and then sampling the other segments.

Step 203: reconstructing the magnetic resonance image according to the phase encoding lines within k-space.

By then, the method for suppressing residual motion artifacts according to the present invention is completed.

The method for suppressing residual motion artifacts according to the present invention can be combined with various gate-control technologies which are currently available, and can also be realized in various sequences, such as Gradient Echo (GRE), Turbo Spin Echo (TSE) and so on. The method according to the present invention is analogous to a new partial averaging technology, which can partly increase the signal-to-noise ratio under the condition of not re-sampling the entire k-space data.

Thus far, the method for suppressing residual motion artifacts has been described in detail, and the embodiments of the device for suppressing residual motion artifacts will be described below.

Figure 5:
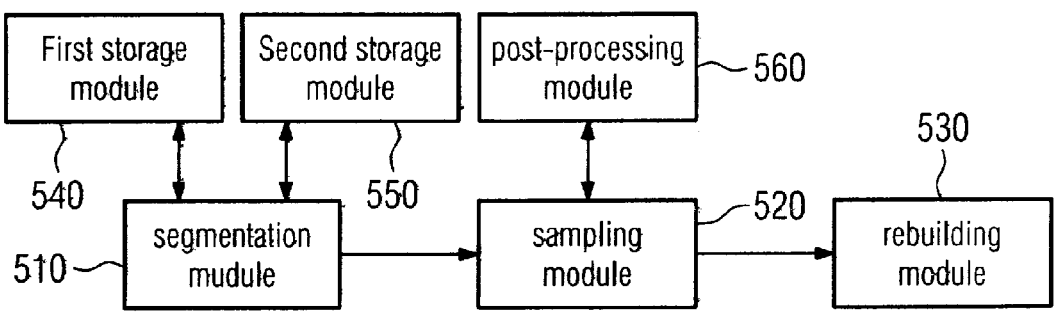
FIG. 5 schematically shows the basic components of a device for suppressing the residual motion artifacts in accordance with the present invention.

FIG. 5 is a schematic view of the construction structure of the device for suppressing the residual motion artifacts according to the present invention. Referring to FIG. 5, the device includes:

a segmentation module 510, for dividing an alternate sampling segment from K-space, said alternate sampling segment being perpendicular to a phase encoding direction;

a sampling module 520, for sampling phase encoding lines within the alternate sampling segment, and exchanging the phase encoding direction and a readout encoding direction once for every N phase encoding lines being sampled until all the phase encoding lines within the alternate sampling segment have been sampled; and said N being an integer greater than or equal to 1; and a reconstruction module (530) for reconstructing the magnetic resonance image according to said phase encoding lines within k-space.

The segmentation module 510 shown in FIG. 5 can also be used for dividing k-space into five segments along the direction perpendicular to the phase encoding direction, and for setting the width of each of the segments respectively; the segment located in the middle of k-space is used as a snapshot segment, the segments adjacent to the two sides of said snapshot segment are used as the alternate sampling segments, and the segments adjacent to the outer sides of said alternate sampling segments are used as high frequency segments.

The segmentation module 510 shown in FIG. 5 can also be used for setting the width of the snapshot segment according to the number N of phase encoding lines which can be sampled during a cycle of a physiological activity, for setting the width of said alternate sampling segments according to the width of the snapshot segment and the energy distribution within k-space; and for setting the width of the high frequency segments at the number of the phase encoding lines except the width of the snapshot segment and the width of the alternate sampling segments.

The device shown in FIG. 5 can also include a first storage module 540 for storing a set threshold of the phase encoding lines.

Then, the segmentation module 510 shown can also be used for judging whether the number N of the phase encoding lines which can be sampled during a cycle of a physiological activity is greater than said set threshold of the phase encoding lines, and when the number N is greater than the threshold, it is used for setting the width of the snapshot segment at N/3; otherwise it is used for setting the width of snapshot segment at zero.

The device shown in FIG. 5 can also include a second storage module 550 for storing a set energy percentage.

Then, the segmentation module 510 shown in FIG. 5 can also be used for determining the width of K-space occupied by the energy which accounts for the energy percentage of the total energy in K-space according to the energy distribution within K-space; and for setting said difference between the width of K-space and the width of the snapshot segment as said width of the alternate sampling segment.

The sampling module 520 shown in FIG. 5 can also be used for sampling N times the phase encoding lines according to a natural number sequence of the encoding steps, and exchanging the phase encoding direction and the readout encoding direction once.

The sampling module 520 shown in FIG. 5 can also be used for randomizing the number in accordance with the natural number sequence of the encoding steps so as to obtain a randomized sampling sequence; sampling for N times the phase encoding lines according to the randomized sampling sequence, and exchanging the phase encoding direction and the readout encoding direction once.

The device shown in FIG. 5 can further include a post-processing module 560, for combining the phase encoding lines overlapping within the alternate sampling segment to obtain combination results, and filling the combination results back into corresponding positions within the alternate sampling segment.

The post-processing module 560 can also be used for producing a weighted sum of the overlapped phase encoding lines according to preset weight values and making use of these results obtained by producing the weighted sum as the combination results.

In the method and the device for suppressing residual motion artifacts according to the present invention, by dividing out from the k-space an alternate sampling segment perpendicular to the phase encoding direction, and by sampling the phase encoding lines within the alternate sampling segment with exchanging the phase encoding direction and the readout encoding direction when the phase encoding lines are sampled N times, causes the residual motion artifacts, originally distributed simply along the phase encoding direction, to be dispersed along the phase encoding direction and the readout direction. Since the energy of the residual motion artifacts is fixed, by dispersing this fixed energy to many different locations, the present invention can make the energy at various positions relatively small, so as to achieve the object of suppressing the residual motion artifacts effectively by means of dispersing the energy of the motion artifacts.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for suppressing residual motion artifacts, comprising:
    dividing an alternate sampling segment from k-space, said alternate sampling segment being perpendicular to a phase encoding direction;
    for said alternate sampling segment, exchanging the phase encoding direction and a readout encoding direction once for every N phase encoding lines being sampled until all the phase encoding lines within the alternate sampling segment have been sampled;
    and said N being an integer greater than or equal to 1; and reconstructing a magnetic resonance image according to said phase encoding lines within k-space.

2. The method as claimed in claim 1, wherein dividing the alternate sampling segment from k-space comprises:
    dividing k-space into five segments along the direction perpendicular to the phase encoding direction, and setting the width of each of the segments respectively; and
    taking the segment located in the middle of k-space as a snapshot segment; taking the two segments adjacent to the two sides of the snapshot segment as the alternate sampling segments; and
    taking the segments adjacent to the outer sides of the alternate sampling segments as high frequency segments.

3. The method as claimed in claim 2, wherein setting the width of each of the segments comprises: setting the width of said snapshot segment according to the number N of phase encoding lines which can be sampled during a cycle of a physiological activity;
    setting the width of said alternate sampling segments according to the width of the snapshot segment and the energy distribution within k-space; and
    setting the width of said high frequency segments at the number of the phase encoding lines except the width of the snapshot segment and the width of the alternate sampling segments.

4. The method as claimed in claim 3, wherein setting the width of said snapshot segment according to the number N of phase encoding lines which can be sampled during a cycle of a physiological activity comprises:
    setting a threshold of the phase encoding lines;
    setting the width of the snapshot segment as N/3 if the number N of the phase encoding lines which can be sampled during the cycle of a physiological activity is greater than said threshold of the phase encoding lines; and otherwise setting the width of the snapshot segment as zero.

5. The method as claimed in claim 3, wherein setting the width of said alternate sampling segments according to the width of the snapshot segment and the energy distribution within k-space comprises:
    setting an energy percentage;
    determining the width of k-space occupied by the energy which accounts for the energy percentage of the total energy in k-space according to the energy distribution within K-space; and
    setting said difference between the width of k-space and the width of the snapshot segment as said width of the alternate sampling segments.

6. The method as claimed in claim 1, wherein exchanging the phase encoding direction and the readout encoding direction once for every N phase encoding lines being sampled comprises:
    sampling for N times the phase encoding lines according to a natural number sequence of the encoding steps, and exchanging the phase encoding direction and the readout encoding direction once.

7. The method as claimed in claim 1, wherein exchanging the phase encoding direction and the readout encoding direction once for every N phase encoding lines being sampled comprises:
    randomizing the number in accordance with the natural number sequence of the encoding steps so as to obtain a randomized sampling sequence;
    sampling for N times the phase encoding lines according to said randomized sampling sequence, and exchanging the phase encoding direction and the readout encoding direction once.

8. The method as claimed in claim 1 comprising, after all the phase encoding lines within the alternate sampling segment are sampled:

combining the phase encoding lines overlapping within the alternate sampling segment to obtain combination results, and filling said combination results back into corresponding positions within the alternate sampling segment.

9. The method as claimed in claim 8, wherein combining the phase encoding lines overlapping within the alternate sampling segment to obtain combination results comprises:

producing a weighted sum of said overlapped phase encoding lines according to preset weight values and using the results obtained by producing the weighted sum as the combination results.

10. A device for suppressing residual motion artifacts, comprising:

a segmentation module that divides an alternate sampling segment from k-space, said alternate sampling segment being perpendicular to a phase encoding direction;

a sampling module that samples phase encoding lines within the alternate sampling segment, and exchanging the phase encoding direction and a readout encoding direction once for every N phase encoding lines being sampled until all the phase encoding lines within the alternate sampling segment have been sampled; and said N being an integer greater than or equal to 1; and a reconstructing module that reconstructs the magnetic resonance image according to said phase encoding lines within k-space.

11. The device as claimed in claim 10, wherein:

the segmentation module also divides k-space into five segments along the direction perpendicular to the phase encoding direction, and sets the width of each of the segments respectively; and the segment located in the middle of k-space is used as a snapshot segment, the segments adjacent to the two sides of said snapshot segment are used as the alternate sampling segments, and the segments adjacent to outer sides of said alternate sampling segments are used as high frequency segments.

12. The device as claimed in claim 11, wherein:

said segmentation module also sets the width of said snapshot segment according to the number N of phase encoding lines which can be sampled during a cycle of a physiological activity, sets the width of said alternate sampling segments according to the width of the snapshot segment and the energy distribution within k-space; and sets the width of said high frequency segments at the number of the phase encoding lines except the width of the snapshot segment and the width of the alternate sampling segments.

13. The device as claimed in claim 12, further comprising a first storage module that stores a set threshold of the phase encoding lines; and said segmentation module also used determines whether the number N of the phase encoding lines which can be sampled during a cycle of a physiological activity is greater than said set threshold of the phase encoding lines, and when the number N is greater than the threshold, and sets the width of the snapshot segment at N/3; otherwise setting the width of snapshot segment at zero.

14. The device as claimed in claim 12, further comprising a second storage module for storing a set energy percentage; and said segmentation module also determines the width of k-space occupied by the energy which accounts for the energy percentage of the total energy in k-space according to the energy distribution within k-space; and sets said difference between the width of k-space and the width of the snapshot segment as said width of the alternate sampling segment.

15. The device as claimed in claim 10, wherein:

said sampling module also samples N times the phase encoding lines according to a natural number sequence of the encoding steps, and exchanges the phase encoding direction and the readout encoding direction once.

16. The device as claimed in claim 10, wherein:

said sampling module is also used for randomizing the number in accordance with the natural number sequence of the encoding steps to obtain a randomized sampling sequence; and samples N times the phase encoding lines according to said randomized sampling sequence, and exchanges the phase encoding direction and the readout encoding direction once.

17. The device as claimed in claim 10, further comprising:

a post-processing module that combines the phase encoding lines overlapping within the alternate sampling segment to obtain combination results, and that fills said combination results back into corresponding positions within the alternate sampling segment.

18. The device as claimed in claim 17, wherein:

said post-processing module also produces a weighted sum of said overlapped phase encoding lines according to preset weight values and uses said results obtained by producing the weighted sum as the combination results.

* * * * *